(12) United States Patent
Blednov

(10) Patent No.: US 7,443,264 B2
(45) Date of Patent: Oct. 28, 2008

(54) COMPACT IMPEDANCE TRANSFORMATION CIRCUIT

(75) Inventor: Igor Ivanovich Blednov, Nijmegen (NL)

(73) Assignee: NXP B.V., Eindhoven (NL)

( * ) Notice: Subject to any disclaimer, the term of this patent is extended or adjusted under 35 U.S.C. 154(b) by 367 days.

(21) Appl. No.: 10/565,935

(22) PCT Filed: Jul. 13, 2004

(86) PCT No.: PCT/IB2004/051202

§ 371 (c)(1), (2), (4) Date: Jan. 20, 2006

(87) PCT Pub. No.: WO2005/008694

PCT Pub. Date: Jan. 27, 2005

(65) Prior Publication Data

US 2008/0055015 A1    Mar. 6, 2008

(30) Foreign Application Priority Data

Jul. 23, 2003  (EP) ................................ 03102260

(51) Int. Cl.
*H03H 7/38* (2006.01)
(52) U.S. Cl. .......................................... 333/32; 333/245
(58) Field of Classification Search ................. 333/33, 333/32, 247, 246, 245, 238, 236
See application file for complete search history.

(56) References Cited

FOREIGN PATENT DOCUMENTS

| EP | 1 202 296 A1 | 5/2002 |
|---|---|---|
| WO | WO 00/10179 * | 2/2000 |

* cited by examiner

*Primary Examiner*—Stephen E Jones

(57) ABSTRACT

The present invention relates to an impedance transformation circuit (110; 11a; 11b; 12) with a first contact pad (51) and a second contact pad (52) being spaced-apart and formed on a substrate (20). The impedance transformation circuit comprises at least first circuit element (40) providing a contact area (41) formed on the substrate (20) which is arranged adjacent and between the first (51) and the second (52) contact pad. A first wire element (31) extends over the substrate (20) connecting the first contact pad (51) and a first end portion (41a) of the contact area of the first circuit element (40), whilst at least a second wire element (32) extends over the substrate (20) connecting the second contact pad (52) and a second end portion (41b) of the contact area of the first circuit element (40). The contact area of the first circuit element (40) is shaped such that it is provided a capacitive connection with a predetermined capacitance between the contact area and a fixed reference poteitial. The packing density of the whole circuit can advantageously be increased by having tibe first wire element (31) and the at least second wire element (32) the same shape and having them arranged substantially in parallel to each other and further, by having the first contact's pad (51) and the second contact pad (52) located at opposite sides of the contact area of the at least first circuit element (40). Multiple impedance transformation circuits according to the invention can advantageously combined to a multi-coupled wire impedance transformation circuit (12).

15 Claims, 3 Drawing Sheets

COMPACT IMPEDANCE TRANSFORMATION CIRCUIT

The present invention relates to a compact impedance transformation circuit according to claim 1, a multiple-coupled wire impedance transformation circuit according to claim 13, and a radio frequency device according to claim 15.

The development in mobile telecommunications continues towards ever smaller and compact units, e.g. on the user side handheld units and on the network infrastructure side equipment of Base Transceiver Stations (BTS), which are more and more complicated. This leads to increasing requirements on the miniaturization of the electronic components and structures used in such mobile communication means, as, for instance, mobile phones, pagers, GPS receivers, and wireless communication devices. All these devices contain circuits, which due to use of high frequencies in the range of 0.1 . . . 10 GHz require special circuit elements and circuit designs for the circuit structures, i.e. high frequency related concerns have to be dealt with.

The radio frequency (RF) circuit miniaturization problem is especially important for Mobile Communications equipment, which use the lower part of RF band (0.8 . . . 2.2) GHz, where the distributed circuits, e.g. impedance transformers, delay lines, RF decoupling networks and so on, occupy rather big part of the design. For instance, a quarter wavelength 50 Ohm micro strip line at 1 GHz on printed board with relatively high E=6.15 occupies the area around (5×37) mm². Moreover, the same line considered with an impedance of Zo=10 Ohm, frequently used for Power Amplifiers design, than it will take even more, e.g. an area around (12×32.4) mm².

One major concern in high frequency circuit design is the need for impedance transformation circuits. In RF circuits, a significant area, for instance, of RF amplifiers is occupied with such impedance transformation circuits. This is especially important for power amplifiers, where the input and output impedances of the RF power circuit devices are low, e.g. 0.5 to 3 Ohms. Thus, in case of discrete power transistors, quite large equivalent inductances are required for impedance transformation in pre- and post-match of the impedances of connected circuit stages of a RF device.

FIG. 4 shows a well-known commonly used one cell pre-match circuit 100 with partial opposing inductive coupling between wire loops 131, 132. The circuit 100 is used, for instance, in impedance matching of high power devices with low input and output impedance. There these circuits are often used in a multiple parallel configuration. The impedance transformation circuit 100 is used for impedance transformation between a first contact pad 151 and a second contact pad 152 being spaced-apart and formed on substrates 121, 122. To that effect, the first contact pad 151 provides an input connection and the second contact pad 152 an output connection of the impedance transformation circuit 100. There is a capacitor 140, e.g. a MOS capacitor, having a plate 141, which provides a electrical connection between the wire loops 131, 132. The MOS capacitor 140 is formed on a substrate 123 and is arranged between the first and the second contact pads 151, 152. Further, the wire loop 131 is formed between the substrates 121, 123 and the first contact pad 151 and the plate 141 of the MOS capacitor 140 are connected by the wire loop 131. Furthermore, the wire loop 132 is formed between the substrates 123, 122 and the second contact pad 152 and the plate 141 of the MOS capacitor 140 are connected by the wire lop 1332.

As can be seen from FIG. 4, the wire loop 131 and the wire loop 132 have the shape of an arc and are arranged as much as possible spaced apart to each other for avoiding mutual inductance between both wire loops 131, 132. However, there is nevertheless a partial mutual inductance between the wire loops 131, 132. Because of the current flowing in the transformation circuit substantially in the adjacent part of the wire loops 131, 132 in opposite direction, the mutual inductance of both wire loops 131, 132 decreases the over all inductance of both wire loops 131, 132. Thus, the mutual inductance is a limitation in circuit design of such an impedance transformation circuit 100. Moreover, due to the required spaced apart arrangement of both wire loops 131, 132 the impedance transformation circuit 100 needs much area and also much bond wire length, which is a important factor in production cost, especially if gold is used as wire material.

The problem of the parasitic inductive coupling between the wire loops 131, 132 which decreases the resultant value of the effective over all inductance, is well described, for instance, in "Theory and problems of electronic circuits in SI units" by Josef A Edminister, 1972, McGraw-Hill International Book Company. Accordingly, assumed within working frequency band the first wire loop 21 has an inductance L1 and the second bond wire loop 22 has an inductance L2, the parasitic inductive coupling is an inductance which is described as a mutual inductance M between the both bond wires loops 21, 22. In fact, the resultant inductance is the sum of L1 and L2 reduced by twice the mutual inductance M. That is, there is a noticeable loss in comparison to the maximum possible inductance value of the whole circuit.

As described above, to reduce the undesired coupling between wires, they are moved apart from each other. However, this requires more space in the design and more wire length, which increases needed wire material. Moreover, this implies limitations on circuit design, especially at lower frequencies, where the required inductance values are higher. Experiences with the traditional impedance transformation circuit as shown in FIG. 4 have shown that the higher transformation rate is required the closer the operational frequency is to the cut-off frequency of the low-pass filter and that this low-pass transformation circuit introduces higher phase and signal group time delay distortions. As a result, less wideband impedance transformation characteristic can be provided by the circuit.

In EP 1 202 296 A1 an out-of-plane microcoil using bond wires is introduced. The out-of-plane microcoil includes conductive traces formed on a substrate. The conductive traces are connected by use of standard wire bonding techniques. The conductive traces of each microcoil include first and second spaced-apart contact pads and an elongated interconnect line located between the first and second contact pads. Wire bonding is performed such that a first extends from the first contact pad over the substrate surface to a first end of the interconnect line, and a second wire extends from the second contact pad over the substrate to a second end of the interconnect line. EP 1 202 296 A1 discloses micro coils with large values; however, there is no use thereof in order to provide impedance transformation with desired properties in circuits for RF applications.

There is a need for a more compact impedance transformation circuitry in a RF design which does not cause a significant area, for instance, of an RF amplifier to be occupied with impedance transformation circuitry. Therefore, it is an object of the present invention to have a compact impedance transformation circuit, i.e. it shall be realized with a high packing density. It is a further objective to have an impedance transformation circuit, which can be used in broad band radio frequency applications.

Accordingly, an impedance transformation circuit of the present invention provides impedance transformation between a first contact pad and a second contact pad being spaced-apart and formed on a substrate. The first contact pad is at least used as an input connection and the second contact pad at least as an output connection of the impedance transformation circuit. The impedance transformation circuit comprises further at least a first circuit element, which provides a contact area formed on the substrate and which is arranged adjacent and between the first and the second contact pad. Further, there is a first wire element extending over the substrate, which connects the first contact pad and a first end portion of the contact area of the first circuit element. Furthermore, there is at least a second wire element extending over the substrate, which connects the second contact pad and a second end portion of the contact area of the first circuit element. The wire elements can be formed, for instance, by use of bond wires during a bonding process step in circuit production. The contact area of the first circuit element is shaped to provide a capacitive connection with a predetermined capacitance between the contact area and a fixed reference potential. The fixed reference potential can be any fixed potential, however it is preferred to be a ground potential of the whole circuit. It is understood that also a connection to a potential of a voltage source of the whole circuit can be used.

In a preferred embodiment of the invention, the first wire element and the at least second wire element are formed with the same shape and are arranged substantially in parallel to each other. Further, advantageously the first contact pad and the second contact pad can be located at opposite sides of the contact area of the at least first circuit element. This helps also to increase packing density of the impedance transformation circuit.

Moreover, in case the first and the second wire element are arranged to each other in a configuration according to the invention, a current flowing in the impedance transformation circuit flows in parallel through both wire elements and in the same direction. Thus, the mutual inductance between both wire elements helps increasing the over all inductance of the both wire elements, i.e. the mutual inductance is no longer a problem in circuit design of such impedance transformation circuit.

As to the capacitive connection with a predetermined capacitance between the contact area and a fixed reference potential, the inventor has experienced that the first circuit element can be realized effectively by a metal layer deposited on the top of the substrate or by an oxide semiconductor (MOS) capacitor that can be easily implemented on the substrate.

In comparison to the tradition design shown in FIG. 4, the impedance transformation circuit according to the present invention requires less bond wire length. Further, in general it takes twice less space on the substrate, and provides with same bondwire shape a larger phase shift. Furthermore, with a small modification according to a further development, which is described below, it provides several times wider bandwidth with flat characteristic impedance and linear phase response, and has a flat group delay response in the frequency band. Moreover, it provides a more stable phase response at mismatch conditions. Finally yet importantly, it is an approach to the ideal transmission line with very low losses, wide range of the characteristic impedance Zo, e.g. from $1\Omega$ to $200\Omega$ in a very compact design.

In a further development of the impedance transformation circuit according to the present invention, there is a second circuit element, which can also be located on the substrate. The second circuit element has a first terminal and a second terminal and provides for a predetermined capacitance value between the first and the second terminal. The second circuit element is arranged such that it provides for a capacitive connection between the first contact pad and the second contact pad of the impedance transformation circuit. To that effect, the first terminal is connected to the first connection pad and the second terminal is connected to the second connection pad. It goes without saying, in the circuit design of an impedance transformation circuit according to the further development it is also possible to use on or both of the first terminal and the second terminal of the second circuit element as input connection or output connection, respectively, of the impedance transformation circuit.

For an advantageous increase in packing density of the impedance transformation circuit, at least one of the first terminal and the second terminal of the second circuit element is connected to the respective one of the first and second contact pads via a wire element extending over the substrate. Thus, the second circuit element can be placed nearby the impedance transformation circuit and there is no need for routing a connection line around the whole impedance transformation circuit. Moreover, the wire element can also be realized by bonding wires as the first and the second wire elements of the impedance transformation circuit. By this additional second circuit element, the whole impedance transformation circuit provides several times larger frequency band with flat impedance characteristics, which is quite easy controllable by predetermining the value of the capacitance of the second circuit element in combination with first circuit element.

For providing the capacitive connection between the first contact pad and the second contact pad of the impedance transformation circuit, the second circuit element can be a thin film capacitor or a capacitor formed by coupled strip lines on the substrate, or any other appropriate way, which provides a desired capacitance value. It is noted that a very wideband solution of the impedance transformation circuit realized by using two coupled strip lines provides also more flexibility for the respective application needs.

In a further development of the present invention, there is formed a multi-coupled wire impedance transformation circuit by combination of at least two of the impedance transformation circuits according to the invention, arranged in parallel configuration. In other words, the impedance transformation circuit according to the invention is scalable in number of coupled wire elements and first circuit elements. Hence, desired lower scaled characteristic impedance of the transformation circuit with higher transformed RF current and power can be achieved, which depend essentially of the overall inductance of the impedance transformation circuit and the overall capacitive connection to ground, and so can conveniently designed by the compact circuit arrangement according to the invention.

The impedance transformation circuit according to the present invention can be advantageously used in radio frequency devices from mobile handsets to high power RF transistor modules, in which such circuit can be implemented as a passive circuit block for impedance matching and frequency filtering. Such RF devices can be, for instance, mobile phones, base stations for radio access networks, or signal converters in cable television (CATV) receivers.

The above and other objectives, features, and advantages of the present invention will become clearer from the following description of the preferred embodiments thereof taken in conjunction with the accompanying drawings. It is noted that through the drawings same or equivalent parts remain the same reference number. All drawings are intended to illustrate some aspects and embodiments of the present invention.

Moreover, it should be noted that in case of different embodiments only the differences are described in detail. Circuits are depicted in a simplified way for reason of clarity. It is understood that not all alternatives and options are shown and therefore, the present invention is not limited to the content of the accompanying drawings.

In the following, the present invention will be described in detail by way of example with reference to the accompanying drawings, in which FIG. 1a shows a first embodiment of the impedance transformation circuit formed on a substrate according to the present invention with two bond wires connected together with respective one end at a plate of a MOS capacitor and arranged in parallel such that a current in each bond wire flows in the same direction and the MOS capacitor has a predetermined capacitance which provides a capacitive connection to a ground potential of the impedance transformation circuit;

Figure 1A:
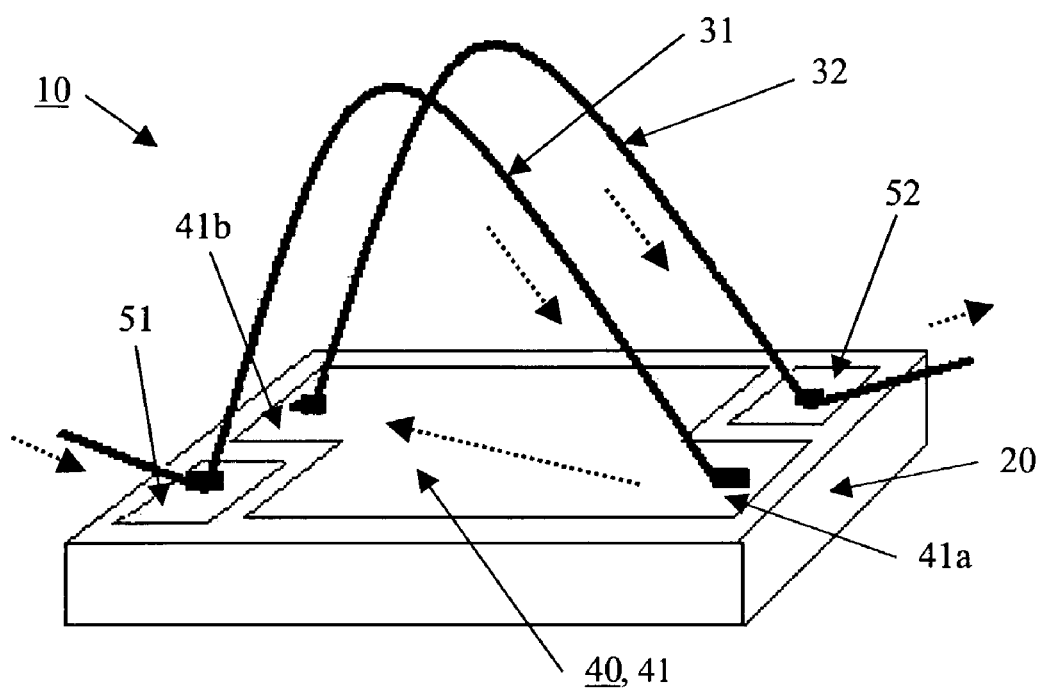
FIG. 1b is an equivalent circuit of the impedance transformation circuits of FIG. 1a (and also of FIG. 2a and FIG. 2b)
Figure 3:
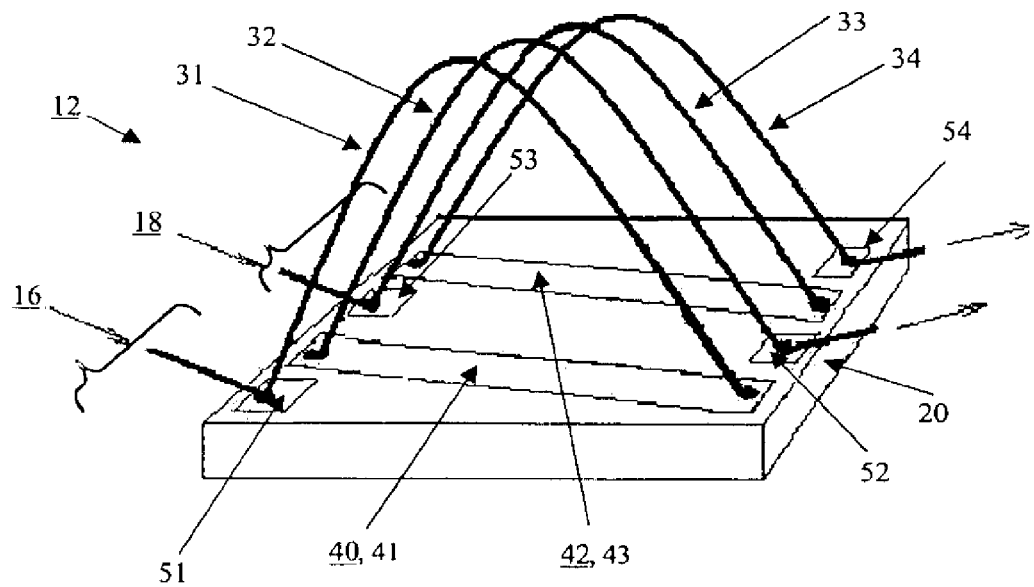
Figure 4:
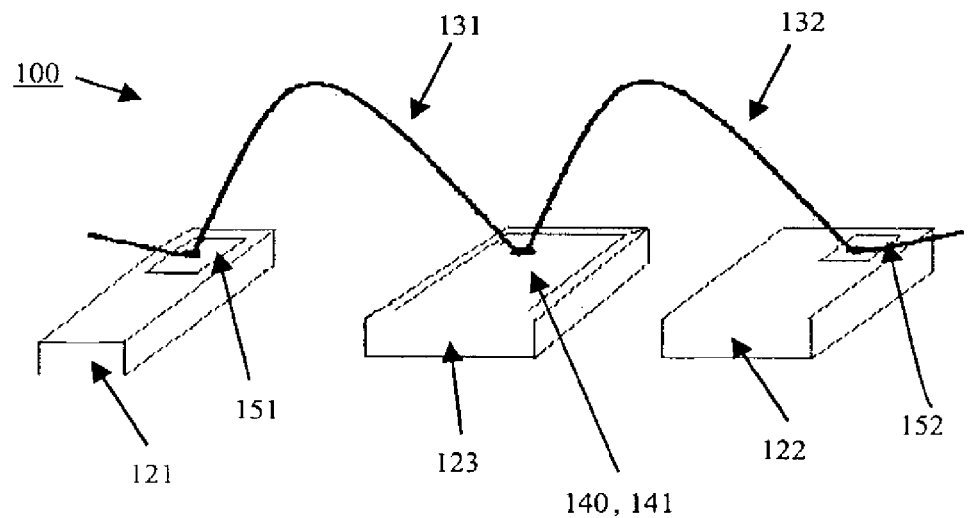

FIG. 3 depicts another further development of the impedance transformation circuit of FIG. 1a where two impedance transformation circuits are arranged on the substrate adjacent to each other and electrically connected in parallel to each other; and FIG. 4 shows a traditional pre-match circuit in a design with partial coupling between two bond wire loops and a MOS capacitor connected to ground at the middle point of the two bond wires.

FIG. 1a shows a first embodiment of the impedance transformation circuit 10 formed on a substrate 20 with two bond wires 31, 32 connected together with respective one end at a plate 41 of a capacitor 40. The two bond wires 31, 32 are arranged adjacent and in parallel such that a current in each of the bond wires 31, 32 flows in the same direction. The capacitor 40, which can be a MOS capacitor or a capacitor of any other applicable kind, on the substrate 20 is designed to have a predetermined capacitance, which provides a capacitive connection to the ground potential of the whole circuit.

The impedance transformation circuit 10 of FIG. 1a provides impedance transformation between a first contact pad 51 and a second contact pad 52 being spaced-apart and formed on the substrate 20. The first contact pad 51 can be used as an input connection and the second contact pad 52 as an output connection of the impedance transformation circuit 10. The capacitor 40 corresponds to the at least first circuit element of the invention, the plate 41 of which provides the contact area of the invention. The capacitor 40 is formed on the substrate and is arranged adjacent and between the first and the second contact pad 51, 52.

Further, the bond wire 31 corresponds to the first wire element of the invention and extends over the substrate 20. The bond wire 31 connects the first contact pad 51 and a first end portion 41a of the plate 41 of the capacitor 40. Furthermore, the bond wire 32 corresponds to the at least second wire element of the invention. The bond wire 32 extends over the substrate 20 and connects the second contact pad 52 and a second end portion 41b of the plate 41 of the capacitor 40.

As can be seen from FIG. 1a, the bond wire 31 and the bond wire 32 have the same shape. Further, the bond wires 31, 32 are arranged substantially in parallel and close to each other. Furthermore, the first contact pad 51 and the second contact pad 52 are located at opposite sides of the plate 41 of the capacitor 40. Due to the arrangement of the bond wires 31, 32, a current (the way of which is symbolically indicated by dotted arrows in the FIG. 1a) flowing in the transformation circuit flows substantially in parallel through both bond wires 31, 32 and in the same direction. Therefore, the mutual inductance between both bond wires 31, 32 increases the overall inductance of the both bond wires 31, 32. Thus, the mutual inductance is not a problem in circuit design of an impedance transformation circuit 10.

Figure 1B:
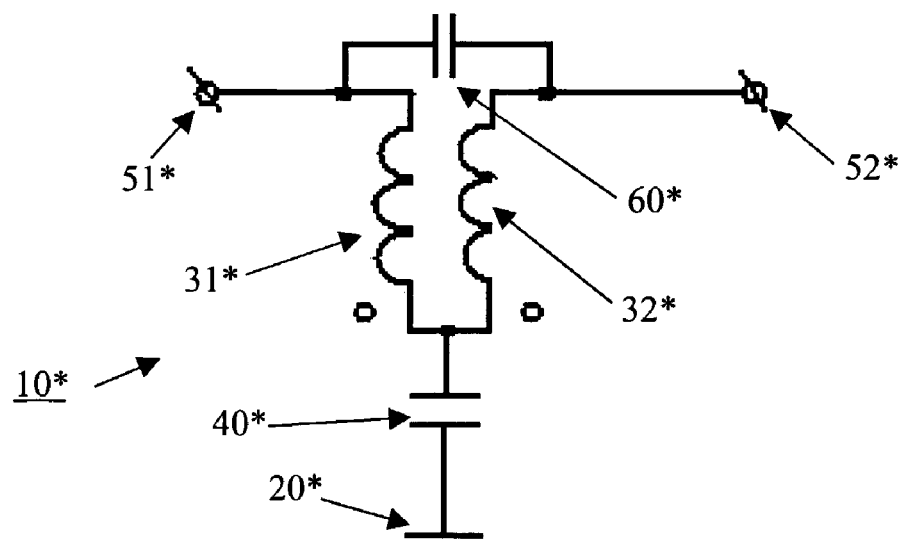

FIG. 1b depicts a possible equivalent circuit 10* of the impedance transformation circuit 10 of FIG. 1a. The equivalent circuit 10* has an input connection 51* and an output connection 52*. Further, there are a first inductance 31* which corresponds to the first bond wire 31 of FIG. 1a, a second inductance 32* which corresponds to the second bond wire 32 of FIG. 1a, and a capacitor 40* which corresponds to the capacitor 40 of FIG. 1a. One end of the capacitor 40* is connected to ground of the equivalent circuit 10* and the opposite end of the capacitor 40* is connected to respective one end of the first inductance 31* and one end of the second inductance 32*. The first inductance 31* is connected with its end not connected with the capacitor 40* to the input connection 51* and the second inductance 32* is connected with its end not connected with the capacitor 40* to the output connection 52*.

The loose inductive coupling between the both inductances 31*, 32* is indicated by the parallel arrangement of both elements in the equivalent circuit 10*. The flowing of a current in the same direction and in parallel in the equivalent circuit 10* is indicated by the small dots beside the inductances 31*, 32*. There is further a capacitor 60* which stands for the overall capacitive coupling of the bond wires 31,32 of FIG. 1a.

Figure 2A:
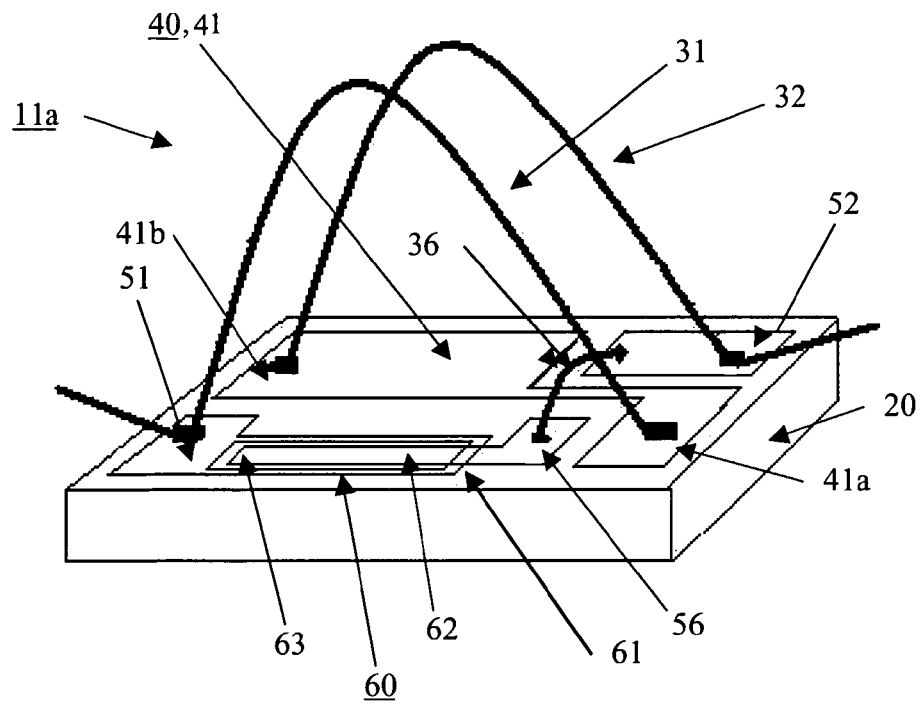
FIG. 2a is an embodiment of a further development of the impedance transformation circuit of the invention where a second capacitance is formed on the substrate, which provides for a predetermined capacitive connection between the input pad and the output pad of the impedance transformation circuit.
Figure 2B:
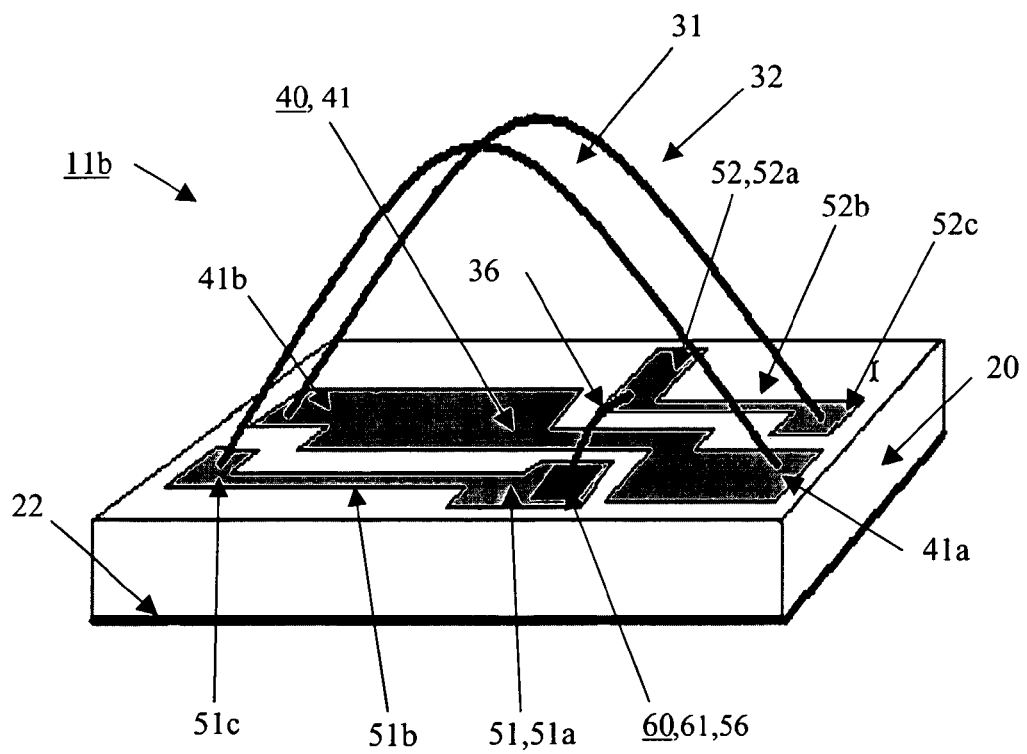
FIG. 2b is further embodiment of the further development of the impedance transformation circuit, which has less parasitic elements.

FIG. 2a and FIG. 2b show embodiments 11a, 11b of impedance transformation circuit according to a further development of the invention where a second capacitor 60 is formed on the substrate 20 which provides for a better predetermined capacitive connection between the input pad 51 and the output pad 52 of the impedance transformation circuits 11a, 11b. Since the principle arrangement of the impedance transformation circuits 11a, 11b of FIGS. 2a and 2b is quite similar to the one of FIG. 1a, only the general differences are described herein below.

The impedance transformation circuits 11a, 11b of FIGS. 2a, 2b occupy nearly the same area on the substrate 20 as the impedance transformation circuit 10 suggested in FIG. 1a. To that effect, the plate 41 of the capacitor 40 is shaped somewhat different to that of FIG. 1a. Nevertheless, the plate 41 of the capacitor 40 provides a predetermined capacitive connection between the first and second bond wires 31, 32 to ground potential of the impedance transformation circuit. In addition to FIG. 1a, there is a second capacitor 60, which is, in the shown further embodiments 11a, 11b, a thin film capacitor. It is noted that it would be also possible to use capacitive coupled strip lines to realize the second capacitor 60, or any other high frequency related circuit design, which provides for the desired capacitive connection.

In FIG. 2a, the second capacitor 60 connects capacitively the first contact pad 51 and the second contact pad 52 of the impedance transformation circuit 11a. The thin film capacitor 60 comprises a first plate 61, which corresponds to the first terminal of the invention, and which is connected to the first contact pad 51. Further, the thin film capacitor 60 has a second plate 62, which corresponds to the second terminal of the invention, and which is connected to a third contact pad 56. Between the first plate 61 and the second plate 62 is located a dielectric medium 63. The third contact pad 56 is connected to the second contact pad 52 via a bondwire 36, which can also be made at the same step in production as the bond wires 31, 32. Thus, a predetermined capacitive connection between the first and the second contact pad 51, 52 is provided by the second capacitor 60.

In FIG. 2b, the second capacitor 60 connects capacitively the first contact pad 51 and the second contact pad 52 of the impedance transformation circuit 11a. The thin film capacitor 60 comprises a first plate 61, which corresponds to the first terminal according to the invention, and which is connected to the first contact pad 51. Further, the thin film capacitor 60 has a second plate 62, which corresponds to the second terminal according to the invention. Between the first plate 61 and the second plate 62 is located a dielectric medium (not shown). The second plate 62 is connected to a first portion 52a of the second contact pad 52 via a bondwire 36, which can also be made at the same step in production as the bond wires 31, 32. Thus, a predetermined capacitive connection between the first and the second contact pad 51, 52 is provided by the second capacitor 60.

In the embodiment of FIG. 2b, the first contact pad 51 is shaped such that the location for the input connection of the impedance transformation circuit 11b is dislocated from the location where the first bond wire 31 is connected. Thus, the fist contact pad 51 comprises an first portion 51a which provides the first plate 61 of the capacitor 60, which also provides the input connection of the impedance transformation circuit 11b. Further, the first contact pad 51 comprises an separate second portion 51c to which the first bond wire 31 is connected. The first portion 51a and the second portion 51c are connected via a strip line 51b. Thus, in comparison to the FIG. 1a and FIG. 2a in FIG. 2b the first contact pad 51 comprises the first portion 51a, the second portion 51c and the strip line 51b. In the same way, the second contact pad 52 is shaped such that the location for the output connection of the impedance transformation circuit 11b is dislocated from the location where the second bond wire 32 is connected. Therefore, the second contact pad 52 comprises an first portion 52a to which one end of the bond wire 36 is connected. The first portion 52a provides also the output connection of the impedance transformation circuit 11b. The second contact pad comprises further a second portion 52c to which the second bondwire 32 is connected. The first portion 52a and the second portion 52c of the second contact pad 52 are connected via a strip line 52b. Thus, in comparison to the FIG. 1a and FIG. 2a in FIG. 2b the second contact pad 52 comprises the first portion 52a, the second portion 52c and the strip line 52b. The inventor has experienced that the circuit design according to FIG. 2b has fewer parasitic elements as the one of FIG. 2a and therefore can be more accurately adapted and designed according to application needs.

A possible equivalent circuit of the impedance transformation circuits 11a, 11b of FIGS. 2a, 2b is quite similar to the one of FIG. 1b. Thus, it will not be described here in detail. However, it is understood that the capacitance 60 provides for a well-defined capacitive coupling between the first contact pad 51 and the second contact pad 52 of the impedance transformation circuits 11a, 11b of FIGS. 2a, 2b. Thus, in analogy to the equivalent circuit of FIG. 1b the capacitance 60* in case of the impedance transformation circuit of FIGS. 2a, 2b represents mainly the capacitance 60 in FIGS. 2a, 2b.

FIG. 3 depicts a further development of the impedance transformation circuit of FIG. 1a where two impedance transformation circuits 16, 18 according to the invention are arranged on the substrate 20 adjacent to each other. The two impedance transformation circuits 16, 18 form a multi-coupled wire impedance transformation circuit 12. The impedance transformation circuits 16, 18 are arranged adjacent to each other on a single substrate 20, wherein the inputs and outputs of the impedance transformation circuit 16 and 18 are united and have the same potential, thus being electrically connected in parallel to each other. Hence, both impedance transformation circuit 16 and 18 share a single common input and a single common output. It is clear that also the impedance transformation circuits of FIG. 2a or 2b could be arranged to build a multi-coupled wire impedance transformation circuit according to the invention.

In FIG. 3, the first contact pad 51 of the first impedance transformation circuit 16 is connected to the first contact pad 53 of the second impedance transformation circuit 18 by a common circuit point (not shown) in the foregoing circuit stage. Further, the second contact pad 52 of the first impedance transformation circuit 16 is connected to the second contact pad 54 of the second impedance transformation circuit 18 by a common circuit point (not shown) in the following circuit stage. Thus both the first impedance transformation circuit 16 and the second impedance transformation circuit 18 are electrically connected in parallel to each other. In other words, the impedance transformation circuit according to the invention is scaled by a factor of 2, providing the resulting characteristic impedance is scaled down by around a factor of 2.

According to the multi-coupled wire effect, there are four coupled wire elements 31, 32, 33, 34. The bond wires 31, 32, 33, 34 can be arranged with respect to each other such that there is also provided a predetermined capacitive and inductive coupling between respective adjacent bond wires, e.g. 31 and 32, 32 and 33, 33 and 43. Thus, the whole impedance transformation circuit has both strong inductive and capacitive coupling between the bond wires 31, 32, 33, 34 helping for wider frequency band operation. Hence, desired characteristics of the impedance transformation circuit which depend essentially of the overall inductance of the impedance transformation circuit and the overall capacitive connection to ground and between the input and output connection of the whole impedance transformation circuit, respectively, can conveniently designed by this compact circuit arrangement.

Experiments of the inventor have shown that minimal required and achievable coupling range between the wire elements is in a range of 0.4 to 0.7. For example, a multi-coupled wire impedance transformation circuit with characteristic impedance Zo of 10Ω and 90 degrees phase shift can be realized with ten pair of coupled wire elements, i.e. five parallel connected impedance transformation circuits according to the invention. In this design, the distance between coupled wire elements in one 50Ω transformation cell as shown in FIG. 2, was 0.12 mm, the wire diameter was 0.038 mm, and the wire material was gold. One wire element had a length of 2.8 mm. The capacity of the MOS capacitors was 23 pF. Desirably, this design of a 10Ω line with 90 degrees phase shift at 2.14 GHz needs just 2.14 mm$^2$ space.

In comparison, to achieve the same characteristic impedance with the traditional impedance transformation circuit of FIG. 4, the required length of each wire element must be around 3.8 mm each, due to the negative mutual inductance, with a capacitance of the first circuit element of C=1.5 pF per each single impedance transformation circuit. However, this leads to difficulties in circuit design and takes at least twice more space than it is required for a circuit according to the present invention. Further, the traditional circuit has a narrower bandwidth of the characteristic impedance. Furthermore, it has phase and group time delay propagation in the frequency band, especially at mismatch conditions or load variations at one of the input and output connections.

It should be noted that the present invention is not restricted to the embodiments of the present invention; in particular, the invention is not restricted to a circuit, which has been used in this specification for reason of example. Moreover, the principle of the present invention can be applied to any application that needs in a high frequency environment a circuit that provides impedance transformation and/or frequency filtering characteristics.

Advantageously, the arrangement of the RF impedance transformation circuit according to the present invention can be used as a passive block for various functions, e.g. input impedance matching, output impedance matching, and interstage impedance matching, and in narrow band pass filters. It is preferably used for wideband RF application. It may be used in modules comprising power amplifiers and/or transceivers for mobile phones, for base stations of radio access networks, for CATV applications, e.g. effecting a transformation from a cable or optical signal to an electrical signal and amplifying it.

In a nutshell, the present invention has introduced an impedance transformation circuit with a first contact pad and a second contact pad being spaced-apart and formed on a substrate. The impedance transformation circuit comprises at least a first circuit element providing a contact area formed on the substrate which is arranged adjacent and between the first and the second contact pad. A first wire element extends over the substrate connecting the first contact pad and a first end portion of the contact area of the first circuit element, whilst at least a second wire element extends over the substrate connecting the second contact pad and a second end portion of the contact area of the first circuit element. The contact area of the first circuit element is shaped such that it is provided a capacitive connection with a predetermined capacitance between the contact area and a fixed reference potential. The packing density of the whole circuit can advantageously be increased by having the first wire element and the at least second wire element the same shape and having them arranged substantially in parallel to each other and further, by having the first contact pad and the second contact pad located at opposite sides of the contact area of the at least first circuit element. Multiple impedance transformation circuits according to the invention can advantageously combined to a multi-coupled wire impedance transformation circuit.

The invention claimed is:

1. An impedance transformation circuit with a first contact pad and a second contact pad being spaced-apart and formed on a substrate, comprising:
   at least a first circuit element providing a contact area formed on the substrate and being arranged adjacent and between the first and the second contact pad,
   a first wire element extending over the substrate connecting the first contact pad and a first end portion of the contact area of the first circuit element,
   at least a second wire element extending over the substrate connecting the second contact pad and a second end portion of the contact area of the first circuit element, wherein the contact area of the first circuit element is shaped to provide a capacitive connection with a predetermined capacitance between the contact area and a fixed reference potential, and
   a second circuit element located on the substrate and having a first terminal and a second terminal, the second circuit element having a predetermined capacitance value and being arranged to provide a capacitive connection between the first contact pad and the second contact pad, wherein the first terminal is connected to the first contact pad and the second terminal is connected to the second contact pad.

2. The impedance transformation circuit according to claim 1, wherein the first wire element and the at least second wire element have the same shape and are arranged substantially in parallel to each other.

3. The impedance transformation circuit according to claim 1, wherein the first contact pad and the second contact pad are located at opposite sides of the contact area of the at least first circuit element.

4. The impedance transformation circuit according to claim 1, wherein the first circuit element is a metal oxide semiconductor (MOS) capacitor.

5. The impedance transformation circuit according to claim 1, wherein the substrate is arranged on a metal layer, which is connected to a fixed reference potential.

6. The impedance transformation circuit according to claim 1, wherein the fixed reference potential is a ground potential.

7. The impedance transformation circuit according to claim 1, wherein the wire elements are bond wires.

8. The impedance transformation circuit according to claim 1, wherein the first contact pad is an input connection and the second contact pad is an output connection of the impedance transformation circuit.

9. The impedance transformation circuit according to claim 1, wherein at least one of the first terminal and the second terminal is connected to the respective one of the first and second contact pads via a wire element extending over the substrate.

10. The impedance transformation circuit according to claim 1, wherein the second circuit element is a thin film capacitor.

11. The impedance transformation circuit according to claim 1, wherein the second circuit element is a capacitor formed by coupled strip lines on the substrate.

12. A multi-coupled wire impedance transformation circuit (12), comprising at least a first (16) and a second (18) impedance transformation circuits according to claim 1 arranged adjacent to each other on a single substrate (20), wherein the first (16) and the second (18) impedance transformation circuits are electrically connected in parallel to each other by the respective first contact pads (51, 53) and second contact pads (52, 54) of the first and second impedance transformation circuits (16, 18).

13. The multi-coupled wire impedance transformation circuit (12) according to claim 12, wherein the wire elements (31, 32, 33, 34) are arranged with respect to each other such that there is provided a predetermined capacitive and inductive coupling between adjacent wire elements.

14. A radio frequency device, which comprises functional radio frequency circuitry, having at least one of a passive circuit block for at least one of impedance matching and frequency filtering, the passive circuit block comprising an impedance transformation circuit comprising:
   at least a first circuit element providing a contact area formed on the substrate and being arranged adjacent and between the first and the second contact pad,
   a first wire element extending over the substrate connecting the first contact pad and a first end portion of the contact area of the first circuit element, at least a second wire element extending over the substrate connecting the second contract pad and a second end portion of the contact area of the first circuit element, wherein the contact area of the first circuit element is shaped to provide a capacitive connection with a predetermined capacitance between the contact area and a fixed reference potential, and a second circuit element located on the substrate and having a first terminal and a second terminal, the second circuit element having a predetermined capacitance value and being arranged to provide a capacitive connection between the first contact pad and the second contact pad, wherein the first terminal is connected to the first contact pad and the second terminal is connected to the second contact pad.

15. The radio frequency device according to claim 14, wherein the radio frequency device is a mobile phone, a base station for radio access networks, or a signal converter in cable television (CATV) receivers.

* * * * *